United States Patent [19]

Phillips

[11] Patent Number: 4,577,958
[45] Date of Patent: Mar. 25, 1986

[54] BORE-SIGHTED STEP-AND-REPEAT PROJECTION ALIGNMENT AND EXPOSURE SYSTEM

[75] Inventor: Edward H. Phillips, Middletown, Calif.

[73] Assignee: Eaton Optimetrix, Inc., San Jose, Calif.

[21] Appl. No.: 710,232

[22] Filed: Mar. 11, 1985

Related U.S. Application Data

[63] Continuation of Ser. No. 389,678, Jun. 18, 1982, abandoned.

[51] Int. Cl.[4] .................. G03B 27/52; G03B 27/70; G03B 27/42
[52] U.S. Cl. .................................... 355/43; 355/45; 355/53; 356/401
[58] Field of Search ............... 355/1, 43, 45, 32, 53, 355/54, 67, 78; 33/180 R, 184.5; 356/401, 363; 29/760

[56] References Cited

U.S. PATENT DOCUMENTS

| | | | |
|---|---|---|---|
| 3,192,844 | 7/1965 | Szasz et al. | 355/78 |
| 3,461,566 | 8/1969 | Gerstner | 33/180 R |
| 3,476,476 | 11/1969 | Chitayat | 355/1 |
| 3,610,750 | 10/1971 | Lewis et al. | 355/43 |
| 3,685,117 | 8/1972 | Wing et al. | 29/760 |
| 3,704,946 | 12/1972 | Brault et al. | 355/53 X |
| 3,716,296 | 2/1973 | Springer et al. | 355/53 |
| 3,853,398 | 12/1974 | Kano | 355/43 |
| 3,876,301 | 4/1975 | Kosugi | 355/53 |
| 3,917,399 | 11/1975 | Buzawa et al. | 355/43 |
| 3,940,211 | 2/1976 | Johannsmeier | 355/53 |
| 3,984,186 | 10/1976 | Momose et al. | 355/45 |
| 4,011,011 | 3/1977 | Hemstreet et al. | 355/18 |
| 4,040,736 | 8/1977 | Johannsmeier | 355/45 |
| 4,057,347 | 11/1977 | Moriyama et al. | 355/67 |
| 4,110,762 | 8/1978 | Tigreat | 355/53 X |
| 4,128,331 | 12/1978 | Nakamura | 355/32 |
| 4,311,390 | 1/1982 | Phillips | 356/363 X |
| 4,362,389 | 12/1982 | Koizumi et al. | 356/401 |
| 4,367,046 | 1/1983 | Lacombat | 355/53 X |
| 4,414,749 | 11/1983 | Johannsmeier | 33/180 R |
| 4,422,755 | 12/1983 | Phillips | 355/43 |
| 4,437,758 | 3/1984 | Suzuki | 355/53 X |
| 4,452,526 | 6/1984 | Johannsmeier et al. | 355/43 |
| 4,473,293 | 9/1984 | Phillips | 355/53 |

FOREIGN PATENT DOCUMENTS

| | | |
|---|---|---|
| 17759 | 10/1980 | European Pat. Off. |
| 17044 | 10/1980 | European Pat. Off. |
| 2009284 | 9/1970 | Fed. Rep. of Germany |
| 1508408 | 11/1967 | France |
| 2082213 | 10/1971 | France |

*Primary Examiner*—Richard A. Wintercorn
*Attorney, Agent, or Firm*—Roland I. Griffin

[57] ABSTRACT

A projection lens and a source of exposure light are employed for projecting an image of a reticle onto a first reference mark or a semiconductive wafer, both of which are movably supported in the image plane of the projection lens. Optical apparatus, including a source of nonexposure light and the projection lens, is provided for imaging a second adjustable reference mark onto the first reference mark or the semiconductive wafer to facilitate use of the projection lens in aligning a semiconductive wafer covered with a photoresist opaque to exposure light.

57 Claims, 12 Drawing Figures

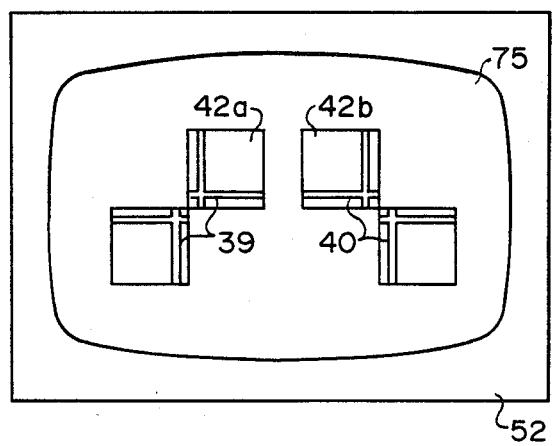
Figure 5
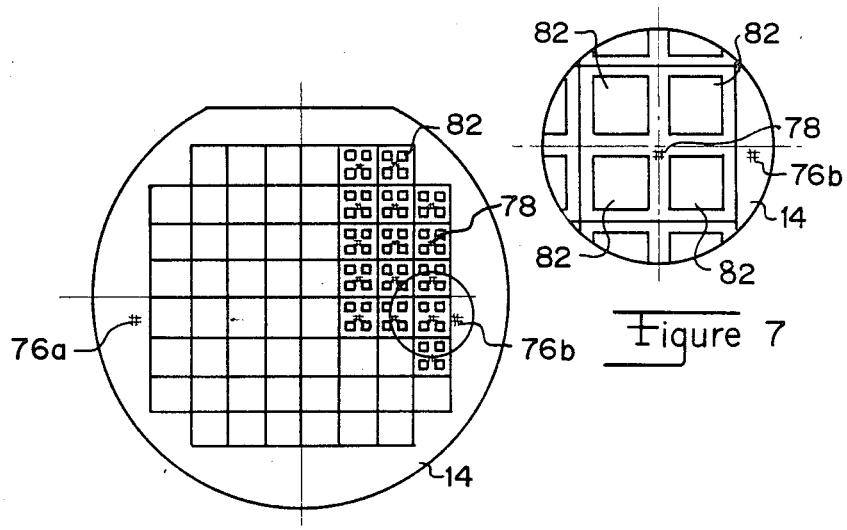
Figure 6
Figure 7
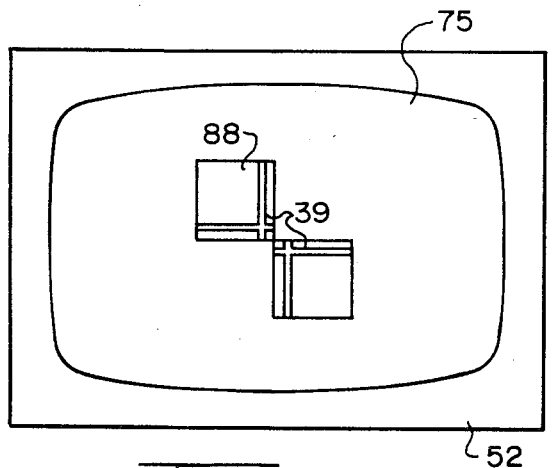
Figure 8A
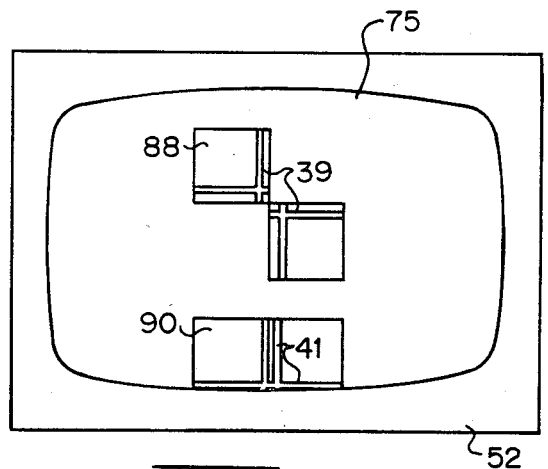
Figure 8B

BORE-SIGHTED STEP-AND-REPEAT PROJECTION ALIGNMENT AND EXPOSURE SYSTEM

CROSS REFERENCE TO RELATED APPLICATION

This is a continuation of application Ser. No. 389,678, filed June 18, 1982, now abandoned.

RELATED APPLICATIONS

The subject matter of this application is related to that of U.S. patent application Ser. No. 289,790 entitled IMPROVED STEP-AND-REPEAT PROJECTION ALIGNMENT AND EXPOSURE SYSTEM WITH AUXILIARY OPTICAL UNIT and filed on Aug. 3, 1981, by Edward H. Phillips, (issued as U.S. Pat. No. 4,452,526 on June 5, 1984) which is a continuation of U.S. patent application Ser. No. 126,007 filed on Feb. 29, 1980, (abandoned;) to that of U.S. patent application Ser. No. 396,099 entitled IMPROVED STEP-AND-REPEAT PROJECTION ALIGNMENT AND EXPOSURE SYSTEM and filed on July 7, 1982, by Edward H. Phillips; (issued as U.S. Pat. No. 4,473,293 on Sept. 25, 1984), which is a continuation of U.S. patent application Ser. No. 026,722 filed on Apr. 3, 1979 (abandoned) to that of U.S. patent application Ser. No. 278,402 entitled IMPROVED ALIGNMENT AND EXPOSURE SYSTEM WITH AN INDICIUM OF AN AXIS OF MOTION OF THE SYSTEM and filed on June 29, 1981, by Karl-Heinz Johannsmeier, (issued as U.S. Pat. No. 4,414,749 on Nov. 15, 1983) which is a continuation of U.S. patent application Ser. No. 053,995 filed on July 2, 1979, (abandoned;) and to that of U.S. patent application Ser. No. 388,147 entitled FRONTAL ILLUMINATION SYSTEM FOR SEMICONDUCTIVE WAFERS and filed on June 14, 1982 by Edward H. Phillips, (issued as U.S. Pat. No. 4,422,755 on Dec. 27, 1983) which is a continuation of U.S. patent application Ser. No. 113,375 filed on Jan. 18, 1980 (abandoned). All of the aforementioned U.S. patent applications are assigned to the same assignee as the present application, are incorporated herein by reference, and are hereinafter referred to by serial number alone.

BACKGROUND AND SUMMARY OF THE INVENTION

This invention relates generally to step-and-repeat alignment and exposure systems for aligning each of an array of different regions of an object, such as a semiconductive wafer, with respect to an image of another object, such as a reticle, and for photometrically printing that image at each of those regions by employing a projection lens of the reduction type. More specifically, this invention relates to improved optical apparatus for use in such systems to facilitate utilization of the projection lens in aligning each region of the semiconductive wafer with respect to the image of the reticle.

In each of U.S. patent applications Ser. Nos. 289,790, 396,099, 278,402 and 388,147 improved step-and-repeat alignment and exposure systems are disclosed that may be employed for aligning each of an array of inchoate dice regions of a semiconductive wafer with respect to an image of a main reticle containing a level of microcircuitry to be photometrically printed at each of those inchoate dice regions. Each system includes a main stage movable along orthogonal axis of motion of the system, a substage mounted on the main stage for aligning a reference mark with respect to the orthogonal axes of motion of the system, a rotatable vacuum chuck mounted on the main stage for holding the semiconductive wafer, a reticle stage mounted above the main stage for holding main reticle, and a projection lens disposed between the main stage and the reticle stage and operable with an associated beam splitter and an associated objective lens unit for directly viewing an aerial image of the image of the main reticle and also of the reference mark or the semiconductive wafer depending on the position of the main stage.

Thus, while employing the projection lens and its associated split-field objective lens unit to directly view aerial image of the image of the main reticle and also of the reference mark, the main stage and the substage can be employed to align the reference mark with respect to the orthogonal axes of motion of the system during a reference mark set-up alignment operation, and the main stage and the reticle stage can thereafter be employed to align images of global alignment marks disposed on the main reticle (at opposite sides thereof) with respect to corresponding portions of the reference mark and, hence, with respect to the orthogonal axes of motion of the system during a main reticle alignment operation. Similarly, while subsequently employing the projection lens and its associated split-field objective lens unit to directly view the aerial image of the image of the main reticle and also of the semiconductive wafer, the main stage can be employed to alternately align global alignment marks disposed on the semiconductive wafer (at opposite sides thereof) with respect to the images of the global alignment marks of the main reticle to align the semiconductive wafer as a whole with respect to the orthogonal axes of motion of the system during a global wafer alignment operation, and thereafter to align local alignment marks disposed on the semiconductive wafer between selected ones of the inchoate dice regions of the semiconductive wafer with respect to an image of a corresponding local alignment mark on the main reticle to more precisely align each inchoate dice region with respect to the image of the main reticle during a precision region-by-region or local wafer alignment operation.

The projection lens is corrected for exposure light (namely, blue light having a wavelength of 436 nanometers) so that the projection lens can be employed to photometrically print the level of microcircuitry contained on the main reticle at each inchoate dice region of the semiconductive wafer, once that region is aligned with respect to the image of the main reticle, in precise alignment with other previously or yet-to-be printed levels of microcircuitry by exposing a photoresistive film on that region in accordance with that image during a wafer exposure operation. A controllable light source unit, an associated plurality of masking elements, another beam splitter, and an imaging lens disposed between that beam splitter and the main reticle are provided for selectively illuminating different portions of the main reticle with exposure light so that the global and local alignment marks of the semiconductive wafer can be illuminated with exposure light during the global and precision local wafer alignment operations performed with the projection lens and its associated split field objective lens unit without exposing the photoresistive film on each inchoate dice region. However, due to interference patterns that may be created for some photoresistive films or other surface conditions of the semiconductive wafer at the wavelength of the exposure light for which the projection lens is corrected, it is often desirable to employ a photoresistive film that is opaque to the exposure light. In this case the projection lens and its associated split field objective lens unit cannot be employed in performing the global and precision local wafer alignment operations.

As disclosed in U.S. patent application Ser. Nos. 289,790 and 396,099, the controllable light source unit can be adjusted to selectively illuminate the reticle with nonexposure light of longer wavelength (namely, green light having a wavelength of 546 nanometers), and a compensating lens can be moved into position to compensate the projection lens for the nonexposure light of longer wavelength during the global and precision local wafer alignment operations involving a photoresistive film that is opaque to the exposure light. However, a serious disadvantage of this technique is the loss of time in adjusting the controllable light source unit and moving the compensating lens into position for the global and precision local wafer alignment operations and thereafter readjusting the controllable light source unit and moving the compensating lens back out of position for the wafer exposure operation. Moreover, the image plane of the projection lens may be shifted by the compensating lens, thereby resulting in the possibility of serious alignment errors.

In U.S. patent application Ser. No. 289,790 an auxiliary optical unit is disclosed that may be employed in performing the global and precision local alignment operations when the projection lens and its associated split field objective lens unit cannot be so employed due, for example, to the use of a photoresistive film that is opaque to the exposure light. This auxiliary optical unit is disposed above the main stage and offset from the projection lens along one of the orthogonal axes of motion of the system. The auxiliary optical unit includes an adjustable auxiliary reticle containing an alignment mark, a source of white light for illuminating the auxiliary reticle, and an auxiliary objective lens unit for directly viewing an image of the alignment mark of the auxiliary reticle and also either the reference mark or the semiconductive wafer depending on the position of the main stage.

Thus, while employing the auxiliary objective lens unit to directly view the image of the alignment mark of the auxiliary reticle and also the reference mark, the main stage and the adjustable auxiliary reticle can be employed to align the alignment mark of the auxiliary reticle with respect to the reference mark and, hence, with respect to the orthogonal axes of motion of the system and thereby also measure the offset between the projection lens and the auxiliary objective lens unit during an auxiliary reticle set-up alignment operation. While thereafter employing the auxiliary objective lens unit to directly view the image of the alignment mark of the auxiliary reticle and also the semiconductive wafer, the main stage can be employed to align each global alignment mark of the semiconductive wafer with respect to the image of the alignment mark of the auxiliary reticle and, hence, with respect to the orthogonal axes of motion of the system during the global wafer alignment operation and subsequently to align each local alignment mark of the semiconductive wafer with respect to the image of the alignment mark of the auxiliary reticle during the precision local wafer alignment operation. The main stage can thereupon be moved to coordinate positions determined by the measured offset between the projection lens and the auxiliary objective lens unit so that the projection lens may be employed to photometrically print the level of microcircuitry contained on the main reticle at each inchoate dice region of the semiconductive wafer.

A serious disadvantage of such an auxiliary optical unit is the loss of time in having to move the main stage by the offset between the projection lens and the auxiliary objective lens unit to perform the global and precision local wafer alignment operations and the additional loss of time in having to move the stage by the same offset to perform the wafer exposure operation. Moreover, the possibility of alignment errors is increased due to the necessity of moving the stage by that offset between the wafer alignment and the wafer exposure operations.

Accordingly, it is the principal object of this invention to provide improved optical apparatus for enabling the projection lens of a step-and-repeat alignment and exposure system, such as those described above, to be employed in performing the global and precision local wafer alignment operations even when a photoresistive film opaque to exposure light of the wavelength for which the projection lens is corrected is disposed on each inchoate dice region of the semiconductive wafer.

Another object of this invention is to provide an improved step-and-repeat alignment and exposure system in which a projection lens, employed for photometrically printing a level of microcircuitry on a semiconductive wafer covered with a photoresistive film opaque to the wavelength of exposure light for which the projection lens is corrected, can be employed in performing the global and precision local wafer alignment operations, as well as the wafer exposure operation, without the necessity of employing a controllable light source unit for selectively illuminating different portions of the main reticle with the exposure light, without the necessity of adjusting the controllable light source unit to selectively illuminate the main reticle with nonexposure light of longer wavelength and concomitantly employing a compensating lens to compensate the projection lens for the nonexposure light, and without the necessity of moving the stage by an offset distance to perform the global and precision local wafer alignment operations or the wafer exposure operation.

Still another object of this invention is to provide an improved step-and-repeat alignment and exposure system as in the last object in which, like the system disclosed in U.S. patent application Ser. No. 388,147 the entire field viewed on the semiconductive wafer by an objective lens unit associated with the projection lens is illuminated by nonexposure light that is of longer wavelength than the exposure light, that does not pass through any reticle, and that does not illuminate the entire semiconductive wafer.

These and other objects, which will become apparent from a reading of this specification and an inspection of the accompanying drawings, are accomplished according to the illustrated preferred embodiment of this invention by employing a split-field objective lens unit, operable with a nonchromatic beam splitter, the projection lens, and a source of exposure light of a wavelength for which the projection lens is corrected, for directly viewing an aerial image of images of the global alignment marks of the main reticle and also of the corresponding portions of the reference mark to facilitate alignment of the images of those global alignment marks with respect to the reference mark during the main reticle alignment operation; by employing a first single-channel objective lens unit, operable with a chromatic beam splitter, the nonchromatic beam splitter, the projecting lens and the source of exposure light, for directly viewing an aerial image of an image of another alignment mark disposed on the main reticle between the global alignment marks and also of a corresponding portion of the reference mark to facilitate alignment of that corresponding portion of the reference mark with respect to the image of that other alignment mark of the main reticle; and by employing an adjustable alignment reticle and a second single-channel objective lens unit, operable with both the chromatic and nonchromatic beam splitters, the projection lens and a first source of nonexposure light of longer wavelength than the exposure light, for imaging an alignment mark of the alignment reticle at the image plane of the projection lens and for directly viewing an aerial image of the image of that alignment mark and also of a corresponding portion of the reference mark to facilitate adjustment of the alignment reticle to align the image of that alignment mark with respect to that corresponding portion of the reference mark and, hence, with respect to the image of the other alignment mark of the main reticle in a boresighting alignment reticle set-up alignment operation. This bore-sighting alignment reticle set-up alignment operation can be repeated as frequently as desired during the operation of the step-and-repeat alignment and exposure system to maintain the alignment accuracy of the system.

Following the bore-sighting alignment reticle set-up alignment operation, the second single-channel objective lens unit can be employed for directly viewing an aerial image of the image of the alignment mark of the alignment reticle and also of each global alignment and local alignment mark of the semiconductive wafer to facilitate alignment of each of those alignment marks of the semiconductive wafer with respect to the image of the alignment mark of the alignment reticle during the global and precision local wafer alignment operations. Additional optical apparatus, including an apertured field-stop plate and a second source of nonexposure light of the same wavelength as the first source of nonexposure light, is employed for illuminating the entire field viewed in the image plane of the projection lens by the second single-channel objective lens unit with the nonexposure light to facilitate locating the global alignment marks of the semiconductive wafer during the global wafer alignment operation.

DESCRIPTION OF THE DRAWINGS

FIG. 5 is a split-field view of portions of the reference mark illuminated by images of a pair of global alignment marks of a first or higher level main reticle as viewed on the face of a first TV monitor of the system of FIG. 1.

FIG. 6 is a plan view of a semiconductive wafer employed in the system of FIG. 1.

FIG. 7 is an enlarged plan view of a portion of the semiconductive wafer of FIG. 6.

FIGS. 8A and 8B are views of portions of the reference mark illuminated by an image of another alignment mark of a main reticle used for positive photoresists and by an image of another alignment mark of a main reticle used for negative photoresists, respectively, as viewed on the face of the first TV monitor of the system of FIG. 1.

DESCRIPTION OF THE PREFERRED EMBODIMENT

Figure 1:
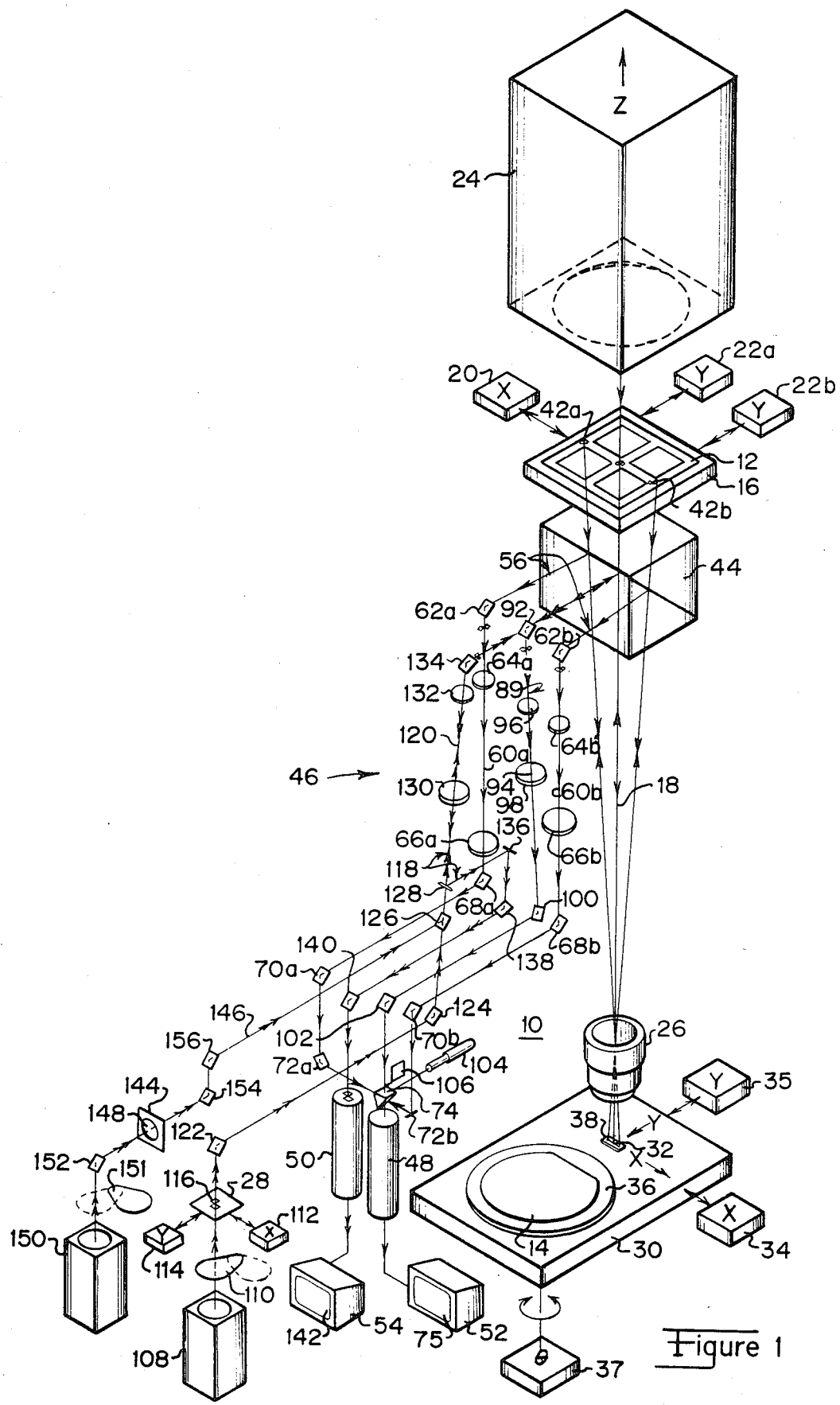
FIG. 1 is an isometric view of a step-and-repeat alignment and exposure system according to the preferred embodiment of this invention.

Referring now to FIG. 1, there is shown a precision step-and-repeat alignment and exposure system 10 for repeatedly photometrically printing a level of microcircuitry contained on a first object, such as a main reticle 12, at an array of adjacent regions of a second object, such as a semiconductive wafer 14, in alignment with other levels of microcircuitry previously printed or yet to be printed at each of those same regions. In this system 10 a reticle stage 16 is employed for holding the main reticle 12 along a vertical optical path 18 of the system. The reticle stage 16 may be moved along orthogonal X and Y axes and rotated about an orthogonal Z axis of the system 10 by an X-axis servo drive unit 20 and a pair of differential Y-axis servo drive units 22a and 22b coupled to the reticle stage. An exposure light source 24 is disposed along the vertical optical path 18 above the reticle stage 16 and employed for illuminating the main reticle 12 with, for example, blue exposure light having a wavelength of 436 nanometers. The exposure light source 24 includes a shutter and an adjustable shadow mask of conventional design not shown. A 10:1 reduction type projection lens 26 is disposed along the vertical optical path 18 below the reticle stage 16 and employed for projecting an image of the illuminated main reticle into an image plane of the projection lens during alignment and exposure operations hereinafter described. The projection lens 26 is also employed for projecting an image of an adjustable alignment reticle 28, which is illuminated by, for example, yellow nonexposure light having a wavelength of 577 nanometers, into the same image plane during alignment operations hereinafter described.

A main stage 30 is disposed below the projection lens 26 and employed for positioning the semiconductive wafer 14 or a reference mark 32 in the image plane of the projection lens along the vertical optical path 18 and with respect to the projected image of the illuminated main reticle 12 or of the illuminated alignment reticle 28. The main stage 30 may be moved along the orthogoanl X and Y axes of the system 10 by an X-axis servo drive unit 34 and a Y-axis servo drive unit 35 coupled to the main stage. A rotatable vacuum chuck 36 for holding the semiconductive wafer 14 is mounted on the main stage 30. The vacuum chuck 36 may be rotated about an axis parallel to the Z axis of the system by a θ servo drive unit 37 coupled to the vacuum chuck.

The reference mark 32 may be formed of bright chrome on a substage 38 of the main stage 30. As fully explained in U.S. patent application Ser. No. 289,790, the substage 38 may be employed to pivot the reference mark 32 with respect to the image plane of the projection lens to precisely position the reference mark in and parallel to that image plane and may be further employed to pivot the reference mark with respect to a plane orthogonal to the image plane of the projection lens to precisely align the reference mark with respect to the orthogonal X and Y axes of motion of the system 10. Once the reference mark 32 is so aligned it serves as a visual indication of the orthogonal X and Y axes of motion of the system 10 and thereby facilitates use of those axes of motion as an absolute frame of reference for the system.

Figure 2:
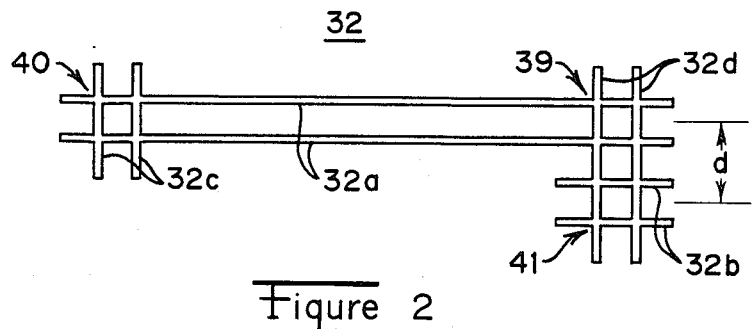
FIG. 2 is a plan view of a reference mark formed on a substage of a main stage of the system of FIG. 1.

As shown in FIG. 2, the reference mark 32 may comprise a first pair of parallel lines 32a and a second pair of shorter parallel lines 32b disposed adjacent to and spaced a finite center-to-center distance d (for example, 100 microns) from the right-hand end of the first pair of parallel lines. All of these parallel lines 32a and 32b are to be aligned with respect to the X axis of motion of the system 10. The reference mark 32 may further comprise a left-hand pair of parallel tic marks 32c orthogonally intersecting the left-hand end portion of the first pair of parallel lines 32a to form a left-hand, double-cross alignment mark 40, and a right-hand pair of longer parallel tic marks 32d orthogonally intersecting both the right-hand end portion of the first pair of parallel lines 32a and the adjacent second pair of parallel lines 32b to form two right-hand, double-cross alignment marks 39 and 41, respectively. Alignment of the parallel lines 32a and 32b with respect to the X axis of motion of the system 10 automatically aligns all of the tic marks 32c and 32d with respect to the Y axis of motion of the system.

Figure 3:
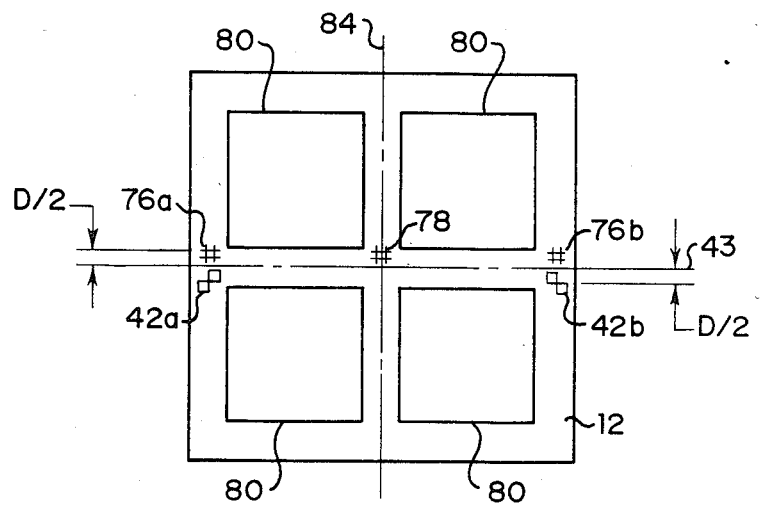
FIG. 3 is a plan view of a first level main reticle employed in the system of FIG. 1 to allow photometric step-and-repeat printing of a first level of microcircuitry contained on that main reticle onto a semiconductive wafer.
Figure 4A:
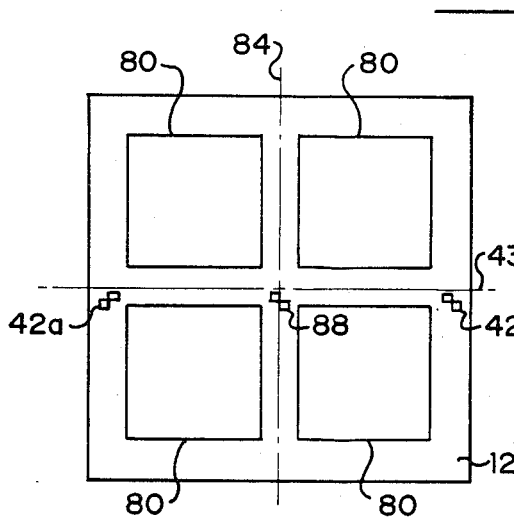
FIGS. 4A and 4B are plan views of second or higher level main reticles employed in the system of FIG. 1 to allow photometric printing of a second or higher level of microcircuitry contained on those main reticles onto a semiconductive wafer coated with a positive photoresist and onto a semiconductive wafer coated with a negative photoresist, respectively.
Figure 4B:
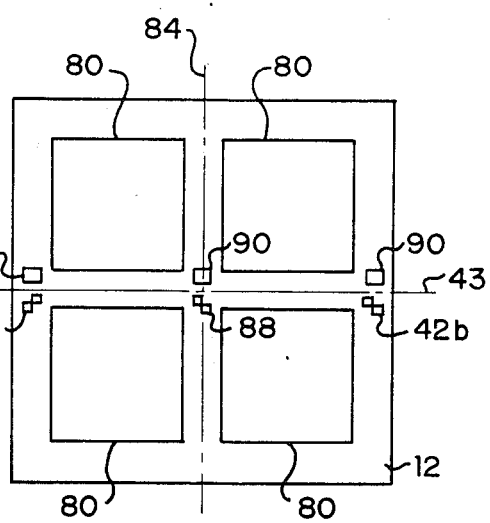

The pair of right-hand and left-hand double-cross alignment marks 39 and 40 are employed for aligning an image of a corresponding pair of global alignment marks 42a and 42b contained on the main reticle 12 during a main reticle alignment operation hereinafter explained. A pair of such global alignment marks 42a and 42b is contained on every first-level main reticle 12, as shown in FIG. 3, and also on every second-level and higher-level main reticle, as shown in FIGS. 4A and 4B. On each main reticle 12 the global alignment marks 42a and 42b are disposed in marginal areas adjacent to opposite sides of the main reticle and spaced a finite center-to-center distance D/2 (for example, 500 microns) below a centerline 43 of the main reticle. The global alignment marks 42a and 42b may each comprise a pair of light or transparent windows on a dark or opaque field as fully explained in U.S. patent application Ser. No. 289,790.

Referring again to FIG. 1, a nonchromatic beam splitter 44 is disposed along the vertical optical path 18 between the reticle stage 16 and the projection lens 26 to provide a port for direct viewing of aerial images of portions of the reference mark 32 or of the semiconductive wafer 14 illuminated by the projected images of the illuminated main reticle 12 or of the illuminated alignment reticle 28. An objective optical system 46 is disposed adjacent to this port and employed with the nonchromatic beam splitter 44 and the projection lens 26 to project the image of the illuminated alignment reticle 28 into the image plane of the projection lens. This objective optical system 46 is further employed with the nonchromatic beam splitter 44, the projection lens 26, first and second TV camera tubes 48 and 50, and associated first and second TV monitor 52 and 54 to view the aerial images of the portions of the reference mark 32 and of the semiconductive wafer 14 illuminated by the projected images of the illuminated main reticle 12 and of the illuminated alignment reticle 28.

The objective optical system 46 includes a dual-channel or split-field objective lens unit 56 for viewing an aerial image of the double-cross alignment marks 39 and 40 of the reference mark 32 as illuminated by projected images of the illuminated global alignment marks 42a and 42b of the main reticle 12. This aerial image is formed by the blue exposure light projected downwardly along the vertical optical path 18 from exposure light source 24 through global alignment marks 42a and 42b of the main reticle 12, a rectangular clearance opening in reticle stage 16, nonchromatic beam splitter 44 and projection lens 26 to the image plane of the projection lens where the double-cross alignment marks 39 and 40 of the reference mark 32 are illuminated. Twenty percent of the blue exposure light reflected upwardly back along the vertical optical path 18 from these illuminated portions of the reference mark 32 and through the projection lens 26 is reflected by the nonchromatic beam splitter 44 along first horizontally-extending portions of a dual optical path 60a and 60b of the system 10.

The split-field objective lens unit 56 includes a pair of beam benders 62a and 62b disposed along the first horizontally-extending portions of the dual optical path 60a and 60b for deflecting the reflected blue exposure light downwardly along first vertically-extending portions of the dual optical path through a pair of infinity-corrected objective lenses 64a and 64b and a pair of imaging lenses 66a and 66b to another pair of beam benders 68a and 68b. These pairs of beam benders 62a and 62b, infinity-corrected objective lenses 64a and 64b, imaging lenses 66a and 66b, and beam benders 68a and 68b provide a pair of pivotably and longitudinally adjustable periscopes as fully explained in U.S. patent application Ser. No. 369,099 to accommodate both horizontal and vertical adjustment of the split-field objective lens unit 56. The pair of beam benders 68a and 68b is disposed for deflecting the reflected blue exposure light forwardly along second horizontally-extending portions of the dual optical path 60a and 60b to another pair of beam benders 70a and 70b, which is in turn disposed for deflecting the reflected blue exposure light downwardly along second vertically-extending portions of the dual optical path to still another pair of beam benders 72a and 72b. This pair of beam benders 72a and 72b is disposed for deflecting the reflected blue exposure light laterally along third horizontally-extending portions of the dual optical path 60a and 60b to a corresponding pair of faces of a split-field prism 74. The split-field prism 74 is disposed for deflecting the reflected blue exposure light from each of those faces in the side-by-side relationship downwardly along a common third vertically-extending portion of the dual optical path 60a and 60b to the input face of the first TV camera tube 48. This first TV camera tube 48 is coupled to the first TV monitor 52 so as to provide a split-field view of the aerial image of the double-cross alignment marks 39 and 40 of reference mark 32 as illuminated by the projected images of the illuminated global alignment marks 42a and 42b of the main reticle 12, as shown in FIG. 5.

While observing this split-field view on the screen 75 of the first TV monitor 52, the substage 38 may be adjusted and the X and Y servo drive units 34 and 35 may be employed to move the main stage 30 as required to precisely position the reference mark 32 in and parallel to the image plane of the projection lens 26 and to align the reference mark with respect to the orthogonal X and Y axes of motion of the system 10 in the same manner as fully described in U.S. patent application Ser. No. 289,790. Following this reference mark set-up alignment operation, the reference mark 32 may be employed for aligning the images of the global alignment marks 42a and 42b of every main reticle 12 employed in the system 10 with respect to the orthogonal axes of motion of the system. This can also be accomplished, while observing the split-field view on the screen 75 of the first TV monitor 52 and in the same manner as fully described in U.S. patent application Ser. No. 289,790, by employing the X and differential Y servo drive units 20, 22a and 22b to align the projected images of the global alignment marks 42a and 42b of each main reticle 12 with respect to the corresponding double-cross alignment marks 39 and 40 of the reference mark 32 precisely as shown in FIG. 5.

As shown in FIG. 3, each first-level main reticle 12 also contains another pair of global alignment marks 76a and 76b and a local alignment mark 78 to be photometrically printed onto each semiconductive wafer 14 processed with that first-level main reticle. On each such first-level main reticle 12, the global alignment marks 76a and 76b are disposed in marginal areas adjacent to opposite sides of the main reticle and spaced the same finite center-to-center distance D/2 (for example, 500 microns) above the centerline 43 of the main reticle as the global alignment marks 42a and 42b are spaced below that centerline. The local alignment mark 78 is disposed in a marginal area of each first-level main reticle 12 between the global alignment marks 76a and 76b and may, for example, also be spaced the same finite center-to-center distance D/2 above the centerline 43 of the main reticle. The global alignment marks 76a and 76b may be photometrically printed in marginal areas of the semiconductive wafer 14, as shown in FIGS. 6 and 7, in the same manner as fully described in U.S. patent application Ser. No. 289,790.

The local alignment mark 78 of the first-level main reticle 12 may be photometrically printed onto the semiconductor wafer 14 together with the first level of microcircuitry contained on the first-level main reticle in a step-and-repeat manner as shown in FIGS. 6 and 7 and as fully explained in U.S. patent application Ser. No. 289,790. This may be done either during the course of or immediately following the printing of the global alignment marks 76a and 76b onto the semiconductive wafer 14 and normally does not require any wafer alignment operation since no other level of microcircuitry has yet been photometrically printed onto or formed in the semiconductive wafer. If, as shown in FIGS. 3, 4A and 4B, the first-level and higher-level main reticles 12 contain four separate rectangular areas 80 of microcircuitry, the local alignment mark 78 of the first-level main reticle 12 will be repetitively photometrically printed onto the semiconductive wafer 14 in a central marginal area between four corresponding inchoate dice regions 82 of the semiconductive wafer, as shown in FIGS. 6 and 7. However, if the first-level and higher-level main reticles 12 contained a single larger rectangular area of microcircuitry, rather than four separate rectangular areas 80, the local alignment mark 78 of the first-level main reticle 12 could be relocated, for example, along a centerline 84 of the first-level main reticle to a marginal area at one side of the first-level main reticle to avoid interference with the microcircuitry. Although the global alignment marks 76a and 76b and the local alignment marks 78 contained on the first-level main reticle 12 may, as shown, all comprise double-cross alignment marks of the same type as the alignment marks 39, 40 and 41 of the reference mark 32, different types of alignment marks could be used.

Following the photometric printing operations involving the first-level main reticle 12, a second-level main reticle 12, such as that shown in FIG. 4A or 4B is positioned on the reticle stage 16 in place of the first-level main reticle. Images of the global wafer alignment marks 42a and 42b of the second-level main reticle 12 are aligned as described above with respect to the corresponding double-cross alignment marks 39 and 40 of the reference mark 32 to align the second-level main reticle with respect to the orthogonal X and Y axes of motion of the system 10. The X and Y axes servo drive units 34 and 35 are then employed for moving the main stage 30 to position the double-cross alignment mark 39 of the reference mark 32 at a coordinate position directly beneath the projection lens 26 where that double-cross alignment mark is illuminated by a projected image of a local alignment mark 88 contained on each second and higher level main reticle 12. The objective optical system 46 also includes a single-channel objective lens unit 89 that can be employed for directly viewing an aerial image of the double-cross alignment mark 39 of the reference mark 32 as illuminated by the image of the local alignment mark 88 contained on any second and higher level main reticle 12.

As best shown in FIGS. 4A and 4B, the local alignment mark 88 is disposed on each second and higher level main reticle 12 in a marginal area between the global alignment marks 42a and 42b and is spaced below the centerline 43 of each such main reticle by the same finite center-to-center distance D/2 (for example, 500 microns) as the global alignment marks 42a and 42b. However, the local alignment mark 88 could be relocated, for example, along the centerline 84 of each such main reticle 12 to a marginal area at one side of the main reticle to avoid interference with any different configuration of microcircuitry as mentioned above. Although the local alignment mark 88 of each such main reticle 12 may, as shown, be of the same type as the global alignment marks 42a and 42b of each such main reticle, different types of alignment marks could be used.

A second or higher level main reticle 12 of the type shown in FIG. 4A, is employed when processing a semiconductive wafer 14 coated with a positive photoresist. However, if a main reticle 12, such as that shown in FIG. 4A, were employed when processing a semiconductive wafer 14 coated with a negative photoresist, the global and local double-cross alignment marks 76a, 76b and 78 of the semiconductive wafer 14 could be obliterated during subsequent processing. This problem can be eliminated by employing a second or higher level main reticle 12 of the type shown in FIG. 4B when processing a semiconductive wafer 14 coated with negative photoresist. A separate transparent rectangular window 90 is included on each such main reticle 12 adjacent to each of the global alignment marks 42a, 42b and 88 and spaced the same finite center-to-center distance D/2 above the centerline 43 as the double-cross alignment marks 76a, 76b and 78 are spaced above the centerline 43 of each first-level main reticle 12. Thus, each such transparent rectangular window 90 of a second and higher level main reticle 12 of the type shown in FIG. 4B serves to expose the negative photoresist overlying the corresponding double-cross alignment mark 76a, 76b or 78 of the semiconductive wafer 14 and thereby prevent subsequent processing from obliterating that double-cross alignment mark.

The single-channel objective lens unit 89 includes a cold mirror 92 disposed along a first horizontally-extending portion of an optical path 94 of the system 10 and serving as a chromatic beam splitter for deflecting the blue exposure light and transmitting the yellow nonexposure light. Cold mirror 92 therefore deflects the blue exposure light, which is reflected forwardly along the first horizontally-extending portion of the optical path 94 by the nonchromatic beam splitter 44, downwardly along a first vertically-extending portion of the optical path 94 through an infinity-corrected objective lens 96 and an associated imaging lens 98 to a beam bender 100. The cold mirror 92, the infinity-corrected objective lens 96, the imaging lens 98, and the beam bender 100 serve as a pivotably and longitudinal adjustable periscope in the same manner as fully described in U.S. patent application Ser. No. 369,099.

Beam bender 100 is disposed for deflecting the reflected blue exposure light forwardly along a second horizontally-extending portion of the optical path 94 to another beam bender 102, from which the reflected blue exposure light is in turn deflected downwardly along a second vertically-extending portion of optical path 94. An actuator 104, such as an air cylinder, is employed for moving the split-field prism 74 out of the dual-channel optical path 60a and 60b and moving a blocking plate 106 into that optical path. The blue exposure light deflected downwardly along the second vertically-extending portion of the optical path 94 thereby impinges upon the input face of the first TV camera tube 48. A view of the aerial image of the double-cross alignment mark 39 of the reference mark 32 as illuminated by the projected image of the local alignment mark 88 of the second-level main reticle 12 is thereby produced on the screen 75 of the first TV monitor 52, as shown in FIGS. 8A and 8B, depending on whether a second-level main reticle for positive photoresists or negative photoresists is being employed. While observing the view of this aerial image provided by the first TV monitor 52, the X and Y axes servo drive units 34 and 35 may be employed for moving the main stage 30 to precisely align the double-cross alignment mark 39 of the reference mark 32 with respect to the image of the illuminated corresponding local alignment mark 88 of the second-level main reticle 12.

Referring again to FIG. 1, the system 10 includes a first nonexposure light source 108 for illuminating the adjustable alignment reticle 28 with the yellow nonexposure light when a shutter 110 associated with that light source is opened, as shown in dashed lines. The system 10 also includes an X-axis servo drive unit 112 and a Y-axis servo drive unit 114 coupled to the alignment reticle 28 and employed for moving the alignment reticle along the orthogonal X and Y axes of the system to align an image of an illuminated alignment mark 116 of the alignment reticle with respect to the double-cross alignment mark 41 of the reference mark 32. Accordingly, the objective optical system 46 includes a single-channel objective lens unit 118 disposed along another optical path 120 of the system 10 with the first nonexposure light source 108 and the alignment reticle 28 to image the illuminated alignment mark 116 of the alignment reticle at the image plane of the projection lens 26 and also to directly view an aerial image of the double-cross alignment mark 41 of the reference mark 32 as illuminated by the image of the illuminated alignment mark of the alignment reticle. The illuminated alignment mark 116 of the alignment reticle 28 may, as shown, be of the same type as the global alignment marks 42a and 42b of each main reticle 12.

The single-channel objective lens unit 118 includes a beam bender 122 disposed for deflecting yellow nonexposure light, which is directed upwardly along a first vertically-extending portion of optical path 120 through the alignment mark 116 of the alignment reticle 28, forward along a first horizontally-extending portion of the optical path 120 to another beam bender 124. Beam bender 124 is disposed for in turn deflecting that yellow nonexposure light upwardly along a second vertically-extending portion of optical path 120 and through a first nonchromatic beam splitter 126, a second nonchromatic beam splitter 128, an imaging lens 130, and an infinity-corrected objective lens 132 to another beam bender 134. These beam benders 124 and 134, beam splitters 126 and 128, and lenses 130 and 132 serve as another pivotably and longitudinally adjustable periscope in the same manner as fully described in U.S. patent application Ser. No. 396,099. The beam bender 134 is disposed for deflecting the incident yellow nonexposure light along a second horizontally-extending portion of the optical path 120 and through the cold mirror 92 to the nonchromatic beam splitter 44, from whence that yellow nonexposure light is reflected downwardly through the projection lens 26 onto the double-cross alignment mark 41 of the reference mark 32 in the image plane of the projection lens. It should be noted that the apparently common horizontally-extending and vertically-extending portions of the optical path 94 for blue exposure light, of the optical path 120 for yellow nonexposure light, and of the optical path 18 for both types of light are actually spaced about apart between the projection lens 26 and the cold mirror 92.

Yellow nonexposure light is reflected upwardly back along the optical path 18 from the illuminated double-cross alignment mark 41 of the reference mark 32 disposed in the image plane of the projection lens. This reflected yellow nonexposure light passes back through the projection lens 26 to the nonchromatic beam splitter 44, from which it is reflected back along the optical path 120 through the cold mirror 92, the infinity-corrected objective lens 132 and the imaging lens 130 to the nonchromatic beam splitter 128. This nonchromatic beam splitter 128 is disposed for deflecting the incident reflected yellow nonexposure light along a third horizontally-extending portion of the optical path 120 to a beam bender 136, from which it is reflected downwardly along a third vertically-extending portion of that optical path to another beam bender 138. Beam bender 138 is disposed for deflecting the incident yellow non-exposure light along a fourth horizontally-extending portion of optical path 120 to another beam bender 140, which is in turn disposed for deflecting that yellow nonexposure light downwardly along a fourth vertically-extending portion of that optical path to the input face of the second TV camera tube 50.

Figure 9:
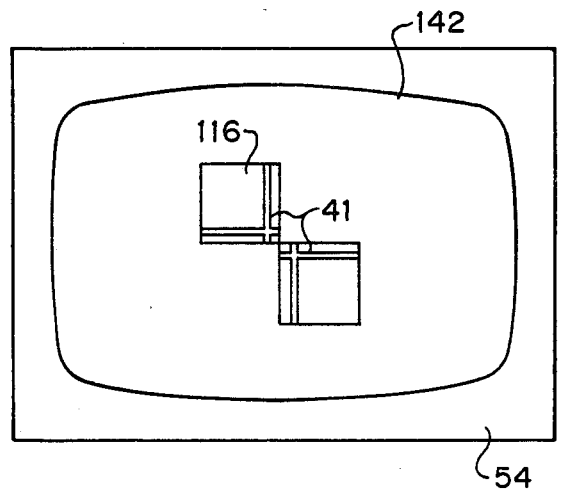
FIG. 9 is a view of a portion of the reference mark illuminated by an image of an alignment mark of an alignment reticle of the system of FIG. 1 as viewed on the face of a second TV monitor of the system.

A view of the aerial image of the double-cross alignment mark 41 of the reference mark 32 as illuminated by the projected image of the illuminated global alignment mark 116 of the alignment reticle 28 is accordingly produced on the screen 142 of the second TV monitor 54 coupled to the second TV camera tube 50. While observing this view of the aerial image provided by the second TV monitor 54, the X and Y axes servo drive units 112 and 114 may be employed for moving the alignment reticle 28 to precisely align the image of the alignment mark 116 of the alignment reticle with respect to the image of the illuminated double-cross alignment mark 41 of the reference mark 32, as shown in FIG. 9. Since the corresponding double-cross alignment mark 39 of the reference mark 32 has concomitantly been aligned with respect to the image of the local alignment mark 88 of the second-level main reticle 12, and since images of the global alignment marks 42a and 42b of the second-level main reticle 12 have previously been aligned with respect to the orthogonal X and Y axes of motion of the system 10, it may be seen that the image of the alignment mark 116 of the alignment reticle 28 has been bore-sighted into alignment with respect to the orthogonal X and Y axes of motion of the system.

Figure 10:
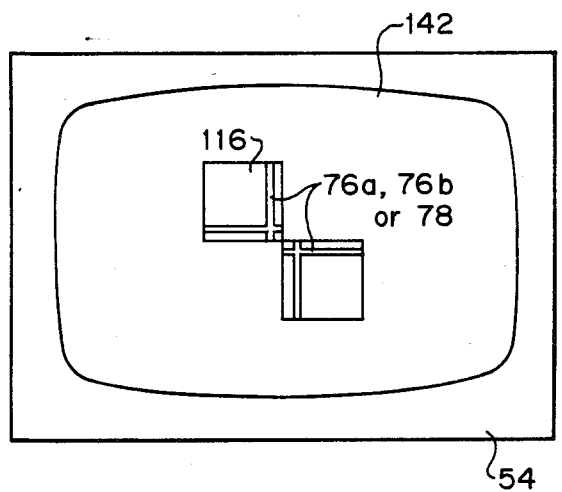
FIG. 10 is a view of a global or local alignment mark of a semiconductive wafer being aligned in the system of FIG. 1 as illuminated by the image of the alignment mark of the alignment reticle and as viewed on the face of the second TV monitor of the system.

Following the foregoing alignment reticle set-up alignment operation, which may be repeated as often as desired to maintain the alignment accuracy of the system 10, both the global and local double-cross alignment marks 76a, 76b and 78 printed on the semiconductive wafer 14 can be precisely aligned with respect to the image of the alignment mark 116 of the alignment reticle 28. This may be done by employing the X and Y axes servo drive units 34 and 35 for moving the main stage 30 to a position directly beneath the projection lens 26 at which the desired double-cross global or local alignment mark 76a, 76b or 78 of the semiconductive wafer 14 is illuminated by the image of the alignment mark 116 of the alignment reticle 28. Then, while observing the view of the aerial image of that double-cross global or local alignment mark 76a, 76b or 78 as illuminated by the image of the alignment mark 116 and as provided on the screen 142 of the TV monitor 54, the X and Y axes servo drive units 34, 35 and the θ servo drive unit 37 are employed as necessary for positioning the semiconductive wafer 14 to align that double-cross alignment mark with respect to the image of the alignment mark 116, as shown in FIG. 10. This operation may be performed in the same way when processing the semiconductive wafer 14 with any second or higher level main reticle 12.

The objective optical system 46 also includes an apertured plate 144 disposed along another optical path 146 of the system 10 at the image plane of imaging lens 130 to provide a field stop 148. A second nonexposure light source 150 is also disposed along this optical path 146 and, when an associated shutter 151 is opened (as shown in solid lines), is employed with a beam bender 152 to uniformily illuminate the field stop 148 with yellow nonexposure light having a wavelength of 577 nanometers. When shutter 151 is opened shutter 110 is normally closed. The yellow nonexposure light passing through the field stop 148 is deflected to the imaging lens 130 by beam benders 154 and 156 and by nonchromatic beam splitters 126 and 128 and is imaged at the image plane of the projection lens 26 by the imaging lens 130, the infinity-corrected lens 132, and the projection lens 26 so as to illuminate the entire field viewed in that image plane by the single-channel objective lens unit 118. This is especially helpful in locating the global alignment marks 76a and 76b on the semiconductive wafer 14 during the global alignment operation.

I claim:

1. A step-and-repeat alignment system for aligning first and second objects, said system comprising:
    first positioning means for holding the first object;
    second positioning means for holding the second object;
    a first reference indicium disposed on the second positioning means;
    first optical means for producing an image of the first object in an image plane of the first optical means;
    said first positioning means being operable for aligning the image of the first object with respect to the first reference indicium;
    third positioning means for holding a second reference indicium; and
    second optical means, operable with the first optical means, for producing an image of the second reference indicium in the image plane of the first optical means;
    said third positioning means being operable for aligning the image of the second reference indicium with respect to the first reference indicium; and
    said second positioning means being operable for aligning the second object with respect to the image of the second reference indicium.

2. A step-and-repeat alignment system as in claim 1 wherein:
    said first positioning means includes first stage means for holding the first object;
    said second positioning means includes second stage means for holding the second object;
    said first reference indicium is disposed on the second stage means;
    said first stage means is operable with the first and second optical means for aligning an image of a first portion of the first object with respect to a portion of the first reference indicium;
    said second stage means is operable with the first and second optical means for aligning a portion of the first reference indicium with respect to an image of a second portion of the first object;
    said third positioning means is operable with the first and second optical means for aligning the image of the second reference indicium with respect to another portion of the first reference indicium; and
    said second stage means is also operable with the first and second optical means for aligning the second object with respect to the image of the second reference indicium.

3. A step-and-repeat alignment system as in claim 1 wherein:
    said first positioning means is operable with the first and second optical means for aligning images of first and second alignment mark portions of the first object with respect to first and second alignment mark portions of the first reference indicium;
    said images of the first and second alignment mark portions of the first object are complementary to the first and second alignment mark portions of the first reference indicium;
    said second positioning means is operable with the first and second optical means for aligning one of the first and second alignment mark portions of the first reference indicium with respect to an image of a third alignment mark portion of the first object;

said image of the third alignment mark portion of the first object is complementary to said one of the first and second alignment mark portions of the first reference indicium;

said third positioning means is operable with the first and second optical means for aligning the image of the second reference indicium with respect to a third alignment mark portion of the first reference indicium;

said image of the second reference indicium is complementary to the third alignment mark portion of the first reference indicium;

said second stage means is also operable with the first and second optical means for aligning an alignment mark portion of the second object with respect to the image of the second reference indicium to align the second object with respect to the image of the second reference indicium; and said image of the second reference indicium is also complementary to the alignment mark portion of the second object.

4. A step-and-repeat alignment system for aligning first and second objects, said system comprising:

first positioning means for holding the first object;

second positioning means for holding the second object;

a first reference indicium disposed on the second positioning means;

first optical means for producing an image of the first object in an image plane of the first optical means;

said first positioning means being operable for aligning the image of the first object with respect to the first reference indicium;

third positioning means for holding a second reference indicium; and second optical means, operable with the first optical means, for producing an image of the second reference indicium in the image plane of the first optical means;

said third positioning means being operable for aligning the image of the second reference indicium with respect to the first reference indicium.

5. A step-and-repeat alignment system as in claim 4 including beam-splitting means, disposed between the first object and the first optical means, for facilitating the viewing of an aerial image of one of the first reference indicium and the second object as illuminated by the image of one of the first object and the second reference indicium.

6. A step-and-repeat alignment system as in claim 5 wherein said second optical means includes an objective lens unit, operable with the beam-splitting means, the first optical means and viewing means, for viewing an aerial image of the first reference indicium as illuminated by the image of the first object.

7. A step-and-repeat alignment system as in claim 6 wherein said viewing means includes a TV camera.

8. A step-and-repeat alignment system as in claim 6 wherein:

said system includes a source of exposure light; and said objective lens unit, beam-splitting means and first optical means are operable with the source of exposure light for producing the aerial image of the first reference indicium as illuminated by the image of the first object.

9. A step-and-repeat alignment system as in claim 8 wherein said source is disposed for directing exposure light through the first object, the beam-splitting means and the first optical means to the image plane of the first optical means so that exposure light reflected from the first reference indicium is directed back through the first optical means and is deflected by the beam-splitting means through the objective lens unit to the viewing means to produce the aerial image of the first reference indicium as illuminated by the image of the first object.

10. A step-and-repeat alignment system as in claim 9 wherein said objective lens unit comprises a split-field objective lens unit.

11. A step-and-repeat alignment system as in claim 10 wherein:

said first reference indicium is aligned with respect to orthogonal axes of motion of the second positioning means;

said aerial image comprises an aerial image of first and second spaced-apart alignment mark portions of the first reference indicium as illuminated by the image of corresponding first and second spaced-apart alignment mark portions of the first object; and said first positioning means may be employed, while viewing that aerial image, to bring the first and second alignment mark portions of the first reference indicium and the image of the corresponding first and second alignment mark portions of the first object into alignment and thereby align the first object with respect to the orthogonal axes of motion of the second positioning means.

12. A step-and-repeat alignment system as in claim 11 wherein said viewing means comprises:

a TV camera; and a TV monitor coupled to the TV camera.

13. A step-and-repeat alignment system as in claim 9 wherein:

said first reference indicium and first object are aligned with respect to orthogonal axes of motion of the second positioning means;

said aerial image comprises an aerial image of an alignment mark portion of the first reference indicium as illuminated by the image of a corresponding alignment mark portion of the first object; and said second positioning means may be employed, while viewing that aerial image, to bring the alignment mark portion of the first reference indicium and the image of the corresponding alignment mark portion of the first object into alignment.

14. A step-and-repeat alignment system as in claim 13 wherein said viewing means comprises:

a TV camera; and a TV monitor coupled to the TV camera.

15. A step-and-repeat alignment system as in claim 5 wherein said second optical means includes an objective lens unit, operable with the beam-splitting means, the first optical means and viewing means, for producing the image of the second reference indicium in the image plane of the first optical means and viewing an aerial image of the first reference indicium as illuminated by the image of the second reference indicium.

16. A step-and-repeat alignment system as in claim 15 wherein said viewing means includes a TV camera.

17. A step-and-repeat alignment system as in claim 15 wherein:

said system includes a source of nonexposure light; and said objective lens unit, beam-splitting means and first optical means are operable with the source of nonexposure light for producing the aerial image of the first reference indicium as illuminated by the image of the second reference indicium.

18. A step-and-repeat alignment system as in claim 17 wherein said source is disposed for directing nonexposure light through the second reference indicium, the objective lens unit, the beam-splitting means and the first optical means to the image plane of the first optical means so that nonexposure light reflected from the first reference indicium is directed back through the first optical means and is deflected by the beam-splitting means through the objective lens unit to the viewing means to produce the aerial image of the first reference indicium as illuminated by the image of the second reference indicium.

19. A step-and-repeat alignment system as in claim 18 wherein:
said first reference indicium is aligned with respect to orthogonal axes of motion of the second positioning means;
said aerial image comprises an aerial image of an alignment mark portion of the first reference indicium as illuminated by the image of the second reference indicium; and
said third positioning means may be employed, while viewing that aerial image, to bring the alignment mark portion of the first reference indicium and the image of the second reference indicium into alignment and thereby align the second reference indicium with respect to the orthogonal axes of motion of the second positioning means.

20. A step-and-repeat alignment system as in claim 19 wherein said viewing means comprises:
a TV camera; and
a TV monitor coupled to the TV camera.

21. A step-and-repeat alignment system as in claim 5 wherein said second optical means includes:
a first objective lens unit, operable with the beam-splitting means, the first optical means and viewing means, for viewing a first aerial image of an alignment mark portion of the first reference indicium as illuminated by the image of a corresponding alignment mark portion of the first object; and
a second objective lens unit, operable with the beam-splitting means, the first optical means and viewing means, for producing the image of the second reference indicium in the image plane of the first optical means and viewing a second aerial image of an alignment mark portion of the first reference indicium as illuminated by the image of the second reference indicium.

22. A step-and-repeat alignment system as in claim 21 wherein:
said first-mentioned viewing means comprises a first TV camera; and
said second-mentioned viewing means comprises a second TV camera.

23. A step-and-repeat alignment system as in claim 21 wherein:
said system includes a source of exposure light;
said first objective lens unit, beam-splitting means and first optical means are operable with the source of exposure light for producing the first aerial image of the alignment mark portion of the first reference indicium as illuminated by the image of the corresponding alignment mark portion of the first object;
said system includes a source of nonexposure light; and
said second objective lens unit, beam-splitting means and first optical means are operable with the source of nonexposure light for producing the second aerial image of the alignment mark portion of the first reference indicium as illuminated by the image of the second reference indicium.

24. A step-and-repeat alignment system as in claim 23 wherein said first-mentioned alignment mark portion of the first reference indicium and said second-mentioned alignment mark portion of the first reference indicium comprise separate alignment mark portions spaced apart by a predetermined finite distance.

25. A step-and-repeat alignment system as in claim 24 wherein:
said source of exposure light is disposed for directing exposure light through the first object, the beam-splitting means and the first optical means to the image plane of the first optical means so that exposure light reflected from the first reference indicium is directed back through the first optical means and is deflected by the beam-splitting means through the first objective lens unit to the first-mentioned viewing means to produce the first aerial image of the first-mentioned alignment mark portion of the first reference indicium as illuminated by the image of the corresponding alignment mark portion of the first object; and
said source of nonexposure light is disposed for directing nonexposure light through the second reference indicium, the second objective lens unit, the beam-splitting means and the first optical means to the image plane of the first optical means so that nonexposure light reflected from the first reference indicium is directed back through the first optical means and is deflected by the beam-splitting means through the second objective lens unit to the second-mentioned viewing means to produce the second aerial image of the second-mentioned alignment mark portion of the first reference indicium as illuminated by the image of the second reference indicium.

26. A step-and-repeat alignment system as in claim 25 wherein:
said first reference indicium and first object are aligned with respect to orthogonal axes of motion of the second positioning means;
said second positioning means may be employed, while viewing the first aerial image, to bring the first-mentioned alignment mark portion of the first reference indicium and the image of the corresponding alignment mark portion of the first object into alignment; and
said third positioning means may concomitantly be employed, while viewing the second aerial image, to bring the second-mentioned alignment mark portion of the first reference indicium and the image of the second reference indicium into alignment and thereby align the second reference indicium with respect to the orthogonal axes of motion of the second positioning means.

27. A step-and-repeat alignment system as in claim 26 wherein:

said first-mentioned viewing means comprises a first TV camera and a first TV monitor coupled to the first TV camera; and said second-mentioned viewing means comprises a second TV camera and a second TV monitor coupled to the second TV camera.

28. A step-and-repeat alignment system as in claim 27 wherein:
said first object comprises a reticle; and
said second object comprises a semiconductive wafer.

29. A step-and-repeat alignment system as in claim 26 wherein:
said source of exposure light comprises a source of blue exposure light; and
said source of nonexposure light comprises a source of yellow nonexposure light.

30. A step-and-repeat alignment system as in claim 23 wherein said second optical means includes beam-splitting means disposed for deflecting exposure light from the first-mentioned beam-splitting means into the first objective lens unit and for transmitting nonexposure light between the first-mentioned beam-splitting means and the second objective lens unit.

31. A step-and-repeat alignment system as in claim 30 wherein:
said first-mentioned beam-splitting means comprises a nonchromatic beam splitter; and
said second-mentioned beam-splitting means comprises a chromatic beam splitter.

32. A step-and-repeat alignment system as in claim 5 wherein said second optical means includes an objective lens unit, operable with the beam-splitting means, the first optical means and viewing means, for viewing an aerial image of an alignment mark portion of the second object as illuminated by the image of the second reference indicium.

33. A step-and-repeat alignment system as in claim 32 wherein said viewing means comprises a TV camera.

34. A step-and-repeat alignment system as in claim 32 wherein:
said system includes a source of nonexposure light; and
said objective lens unit, beam-splitting means and first optical means are operable with the source of nonexposure light for producing the aerial image of the alignment mark portion of the second object as illuminated by the image of the second reference indicium.

35. A step-and-repeat alignment system as in claim 34 wherein said source is disposed for directing nonexposure light through the second reference indicium, the objective lens unit, the beam-splitting means and the first optical means to the image plane of the first optical means so that nonexposure light reflected from the alignment mark portion of the second object is directed back through the first optical means and is deflected by the beam-splitting means through the objective lens unit to the viewing means to produce the aerial image of the alignment mark portion of the second object as illuminated by the image of the second reference indicium.

36. A step-and-repeat alignment system as in claim 35 wherein:
said second reference indicium is aligned with respect to orthogonal axes of motion of the second positioning means; and
said second positioning means may be employed, while viewing the aerial image, to bring the alignment mark portion of the second object and the image of the second reference indicium into alignment and thereby align the second object with respect to the orthogonal axes of motion of the second positioning means.

37. A step-and-repeat alignment system as in claim 36 wherein said viewing means comprises:
a TV camera; and
a TV monitor coupled to the TV camera.

38. A step-and-repeat alignment system as in claim 34 wherein said second optical means includes field illumination means, operable with the beam-splitting means and the first optical means, for selectively illuminating the field viewed in the image plane of the first optical means by the objective lens unit with nonexposure light.

39. A step-and-repeat alignment system as in claim 34 wherein said second optical means includes field illumination means, operable with the objective lens unit, the beam-splitting means and the first optical means, for selectively illuminating the field viewed in the image plane of the first optical means by the objective lens unit with nonexposure light.

40. A step-and-repeat alignment system as in claim 39 wherein said second optical means includes beam-splitting means, disposed between the first-mentioned beam-splitting means and the second reference indicium, for deflecting nonexposure light from the field illumination means through the objective lens unit, the first-mentioned beam-splitting means and the first optical means to the image plane of the first optical means and for transmitting nonexposure light from the second reference indicium through the objective lens unit, the first-mentioned beam-splitting means and the first optical means to the image plane of the first optical means.

41. A step-and-repeat alignment system as in claim 40 wherein:
said field illumination means includes field stop means for defining a field stop;
said system includes another source of nonexposure light for directing nonexposure light through the field stop;
said field illumination means includes imaging means, operable with the second-mentioned beam-splitting means, the second objective lens unit, the first-mentioned beam-splitting means and the first optical means, for imaging nonexposure light passing through the field stop into the image plane of the first optical means; and
shutter means is disposed for selectively permitting the passage of nonexposure light from the first-mentioned source of nonexposure light through the second reference indicium or alternatively from the second-mentioned source of nonexposure light through the field stop.

42. A step-and-repeat alignment system as in claim 5 wherein:
said first reference indicium and second reference indicium are aligned with respect to orthogonal axes of motion of the second positioning means;
said second optical means is operable with the first optical means for viewing a first aerial image of an alignment mark portion of the first reference indicium as illuminated by an image of a corresponding alignment mark portion of the first object;
said first positioning means may be employed, while viewing the first aerial image, to bring the alignment mark portion of the first reference indicium and the image of the corresponding alignment mark portion of the first object into alignment and thereby align the first object with respect to the orthogonal axes of motion of the second positioning means;

said second optical means is operable with the first optical means for viewing a second aerial image of an alignment mark portion of the second object as illuminated by the image of the second reference indicium;

said second positioning means may be employed, while viewing the second aerial image, to bring the alignment mark portion of the second object and the image of the second reference indicium into alignment and thereby align the second object with respect to the orthogonal axes of motion of the second positioning means;

said system includes a source of exposure light disposed for directing exposure light through the first object, the beam-splitting means and the first optical means onto a surface of the second object in the image plane of the first optical means to photmetrically print the image of the first object on that surface of the second object; and said first object includes a selected portion imaged by the first optical means onto the surface of the second object over the alignment mark portion of the second object to prevent the alignment mark portion of the second object from being obliterated by the image of the first object photometrically printed on the surface of the second object.

43. A step-and-repeat alignment system as in claim 42 wherein:

said alignment mark portion of the first reference indicium comprises first and second spaced-apart alignment marks;

said alignment mark portion of the first object comprises corresponding first and second spaced-apart alignment marks;

said alignment mark portion of the second object comprises one or more alignment marks, each of which may be successively aligned with respect to the image of the second reference indicium;

said second reference indicium comprises an alignment mark; and said selected portion of the first object comprises one or more regions corresponding to the alignment marks of the second object.

44. A step-and-repeat alignment system as in claim 4 wherein:

said system includes a source of exposure light disposed for directing exposure light through the first object and the first optical means onto a photoresistive surface of the second object in the image plane of the first optical means to photometrically print the image of the first object on the photoresistive surface of the second object;

said first object includes one or more selected regions imaged by the first optical means onto the photoresistive surface of the second object over one or more corresponding alignment mark portions of the second object to prevent those one or more alignment mark portions of the second object from being obliterated by the image of the first object photometrically printed on the photoresistive surface of the second object.

45. A step-and-repeat alignment system as in claim 44 wherein:

said photoresistive surface of the second object is provided by a coating of positive photoresist; and each of said one or more selected regions of the first object is transparent to the exposure light.

46. A method of aligning first and second objects held by first and second positioning means, respectively, said method comprising the steps of:

aligning a first reference indicium of the second positioning means with respect to an image of the first object while employing exposure light and an imaging lens corrected for exposure light to form the image of the first object;

concomitantly aligning an image of a second reference indicium held by a third positioning means with respect to the first reference indicium while employing nonexposure light and optical means, including the imaging lens, to form the image of the second reference indicium; and subsequently aligning the second object with respect to the image of the second reference indicium while employing nonexposure light and the optical means, including the imaging lens, to form the image of the second reference indicium.

47. A method as in claim 46 wherein:

said first object comprises a reticle; and said second object comprises a semiconductive wafer having a photoresistive layer opaque to the exposure light.

48. A method as in claim 46 wherein:

said first-mentioned aligning step comprises aligning an alignment mark portion of the first reference indicium with respect to an image of a corresponding alignment mark portion of the first object while employing exposure light and the imaging lens to form the image of the corresponding alignment mark portion of the first object;

said second-mentioned aligning step comprises aligning the image of the second reference indicium with respect to another alignment mark portion of the first reference indicium while employing nonexposure light and the optical means, including the imaging lens, to form the image of the second reference indicium; and said third-mentioned aligning step comprises aligning an alignment mark portion of the second object with respect to the image of the second reference indicium while employing nonexposure light and the optical means, including the imaging lens, to form the image of the second reference indicium.

49. A method as in claim 48 wherein:

said first object comprises a reticle; and said second object comprises a semiconductive wafer having a photoresistive layer opaque to the exposure light.

50. A method as in claim 48 including the additional steps of:

printing an image of the first object on a surface of the second object while employing exposure light and the imaging lens; and imaging a selected region of the first object over the alignment mark portion of the second object while employing exposure light and the imaging lens to prevent the alignment mark portion of the second object from being obliterated by the printed image of the first object.

51. A method as in claim 50 wherin said selected region of the first object is transparent to exposure light when the surface of the second object is coated with a positive photoresist.

52. A method as in claim 50 wherein said printing and imaging steps are performed simultaneously following the third-mentioned aligning step.

53. A method as in claim 52 wherein:
said first object comprises a reticle; and
said second object comprises a semiconductive wafer having a photoresistive layer opaque to the exposure light.

54. A method of aligning first and second objects held by first and second positioning means, respectively, said method comprising the steps of:
aligning an image of an alignment mark portion of a first object with respect to a first reference indicium of the second positioning means while employing exposure light and an imaging lens corrected for exposure light to form the image of the first object;
aligning an alignment mark portion of a second object with respect to an image of a second reference indicium while employing nonexposure light and optical means, including the imaging lens, to form the image of the second reference indicium, the image of the second reference indicium being aligned with respect to the first reference indicium; and
subsequently printing an image of the first object, including an image of a selected region of the first object, on a photoresistive surface of the second object, while employing exposure light and the imaging lens, with the image of the selected region of the first object overlying the alignment mark portion of the second object to prevent the alignment mark portion of the second object from being obliterated by the printed image of the first object.

55. A method as in claim 54 wherein:
said first object comprises a reticle; and
said second object comprises a semiconductive wafer.

56. A method as in claim 54 wherein said selected region of the first object is transparent to exposure light when the photoresistive surface of the second object is provided by a coating of positive photoresist.

57. A method as in claim 54 wherein:
said first object comprises a reticle; and
said second object comprises a semiconductive wafer having a photoresistive layer opaque to the exposure light.

* * * * *